United States Patent
Biber (10) Patent No.: US 8,981,777 B2
(45) Date of Patent: Mar. 17, 2015

(54) SPINE COIL ARRAY

(75) Inventor: Stephan Biber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 448 days.

(21) Appl. No.: 12/986,839

(22) Filed: Jan. 7, 2011

(65) Prior Publication Data

US 2011/0169491 A1 Jul. 14, 2011

(30) Foreign Application Priority Data

Jan. 13, 2010 (DE) .......................... 10 2010 004 515

(51) Int. Cl.
*G01R 33/44* (2006.01)
*G01R 33/3415* (2006.01)

(52) U.S. Cl.
CPC .................. *G01R 33/3415* (2013.01)
USPC ........................................................ 324/318

(58) Field of Classification Search
CPC ................................................... G01R 33/3415
USPC ................... 324/300–322; 600/409, 410, 415
See application file for complete search history.

(56) References Cited

U.S. PATENT DOCUMENTS

| | | | |
|---|---|---|---|
| 7,245,127 B2 * | 7/2007 | Feng et al. .................... | 324/318 |
| 7,486,077 B2 | 2/2009 | Hergt et al. | |
| 7,535,230 B2 | 5/2009 | Takagi | |
| 7,696,752 B2 | 4/2010 | Takamori | |
| 2006/0273798 A1 | 12/2006 | Klieger et al. | |
| 2007/0210793 A1 * | 9/2007 | Kiefer ............................ | 324/307 |
| 2008/0015430 A1 | 1/2008 | Takamori | |
| 2008/0106262 A1 * | 5/2008 | Ohsawa ......................... | 324/318 |
| 2008/0129296 A1 * | 6/2008 | Fischer et al. ................. | 324/318 |
| 2008/0143332 A1 * | 6/2008 | Hergt et al. .................... | 324/318 |
| 2008/0197849 A1 * | 8/2008 | Heid et al. ..................... | 324/318 |
| 2009/0224761 A1 | 9/2009 | Umeda | |
| 2011/0031970 A1 * | 2/2011 | Ninomiya et al. ............. | 324/309 |

FOREIGN PATENT DOCUMENTS

| | | |
|---|---|---|
| CN | 101103916 A | 1/2008 |
| CN | 101199420 A | 6/2008 |
| CN | 101261315 A | 9/2008 |
| DE | 10 2004 052 943 A1 | 6/2005 |
| DE | 103 14 215 B4 | 11/2006 |
| JP | 2006014823 A | 1/2006 |

OTHER PUBLICATIONS

German Office Action dated Oct. 25, 2010 for corresponding German Patent Application No. DE 10 2010 004 515.2-54 with English translation.

(Continued)

*Primary Examiner* — Melissa Koval
*Assistant Examiner* — Rishi Patel
(74) *Attorney, Agent, or Firm* — Lempia Summerfield Katz LLC (57) ABSTRACT

The present embodiments relate to a spine coil array for an imaging system that includes a number of coil elements. The density of the coil elements changes at least once from a first region to a second region in at least one direction within the spine coil array.

27 Claims, 5 Drawing Sheets

(56) References Cited

OTHER PUBLICATIONS

German Office Action dated Aug. 16, 2012 for corresponding German Patent Application No. DE 10 2010 004 515.2 with English translation.

Chinese Office Action dated Dec. 19, 2012 for corresponding Chinese Patent Application No. 2011100064279 with English translation.

* cited by examiner

SPINE COIL ARRAY

This application claims the benefit of DE 10 2010 004 515.2, filed on Jan. 13, 2010.

BACKGROUND

The present embodiments relate to a spine coil array.

Magnetic resonance tomography devices (MRTs) for examination of objects or patients by magnetic resonance tomography are known, for example, from DE 10314215B4.

Modern magnetic resonance systems (MRT, MR) operate with coil elements for transmitting high-frequency pulses for nuclear resonance excitation and/or for receiving induced magnetic resonance signals. A magnetic resonance system may include a permanent magnet or (more frequently) a superconducting coil to generate a basic magnetic field (B0) homogeneously in an examination area, a large whole body coil (e.g., a body coil (BC)) installed at a fixed position in the MR device and a number of small local coils (e.g., surface coils or LC). To read out information from which images of a patient may be generated, selected areas of the object or the patient to be examined are read out with gradient coils for three axes (e.g., X, Y approximately radial to the patient, and Z in the longitudinal direction of the patient). The local encoding in magnetic resonance tomography may be realized with the aid of a gradient coil system with three independently controllable, magnetically orthogonal gradient field coil systems. By overlaying the three freely-scalable fields (e.g., in three directions X, Y, Z), the orientation of the plane to be encoded (e.g., gradient field) may be freely selected.

In MR tomography, images with a high signal-to-noise ratio may be recorded with loops. In this process, the excited cores in the coil induce a voltage that is then amplified with a low-noise amplifier (LNA) and forwarded via a cable connection to the receive electronics. To improve the signal-to-noise ratio for high-resolution images as well, high-field systems are used. The basic field strengths of high-field systems may be 3 Tesla or higher. Since a number of coil elements (loops), which are operable to be connected to the MR receive system, are used as receivers, a switching matrix (e.g., an RCCS) is fitted between receive antennas and receivers. This routes the active receive channels to the existing receivers. This makes it possible to connect more loops than there are receivers available, since to cover a body, the coils that are located in the Field of View (FoV) or in the homogeneity volume of the magnet are read out.

The individual antenna elements are also referred to as loops below.

An antenna that may include one or more (array coil) loops is referred to as a coil or spine coil array.

A coil may include, for example, loops, a preamplifier, further electronics and cabling, a housing and a cable with a plug, through which the coil is connected to the system. The system may be an MRT system, for example.

A patient lies in the MRT system on a spinal column array (e.g., a spine coil or spine coil array) built into or resting on a patient bed. This may be used both for producing images of the spinal column and also for imaging other areas of the anatomy covered by this array. For measurements in the abdomen (e.g. liver, heart), an anterior coil may be used, and the spine coil is used as the posterior coil. To provide images of just the spinal column, no additional anterior coil is used. Spine coil arrays known in the prior art cover the patient in the lateral direction (e.g., x direction in an MRT) in this configuration with up to 4 elements.

For the examination of specific organs in the abdomen, the antenna arrangements of spine coil arrays do not have any particular characteristics of specializations. Thus, dedicated cardiac array coils (or translated heart coil arrays) may be used to provide images of the heart (e.g., cardiac imaging) in order to enable better acceleration factors to be achieved. For cardiac imaging, the acceleration and the concomitant reduction in the measurement time is of importance, since the measurement times are still relatively long because of the movement of the heart and the breathing.

Invasive endorectal coils may be used for examining the prostate. It would be advantageous to use non-invasive coils that achieve similar image quality. Also, it would be advantageous to work with far smaller element sizes than in spine or body matrix coils of the prior art.

In accordance with the prior art, cardiac (heart) examinations may be performed using dedicated cardiac arrays (or heart coil arrays). A prostate may be examined by invasive endorectal coils. This is uncomfortable from the patient's point of view, the coil is placed by a doctor, and a coil cover is discarded for hygiene reasons after the examination.

SUMMARY AND DESCRIPTION

The present embodiments may obviate one or more of the drawbacks or limitations in the related art. For example, the use of local coils for an imaging system may be optimized.

DETAILED DESCRIPTION OF THE DRAWINGS

Figure 1:
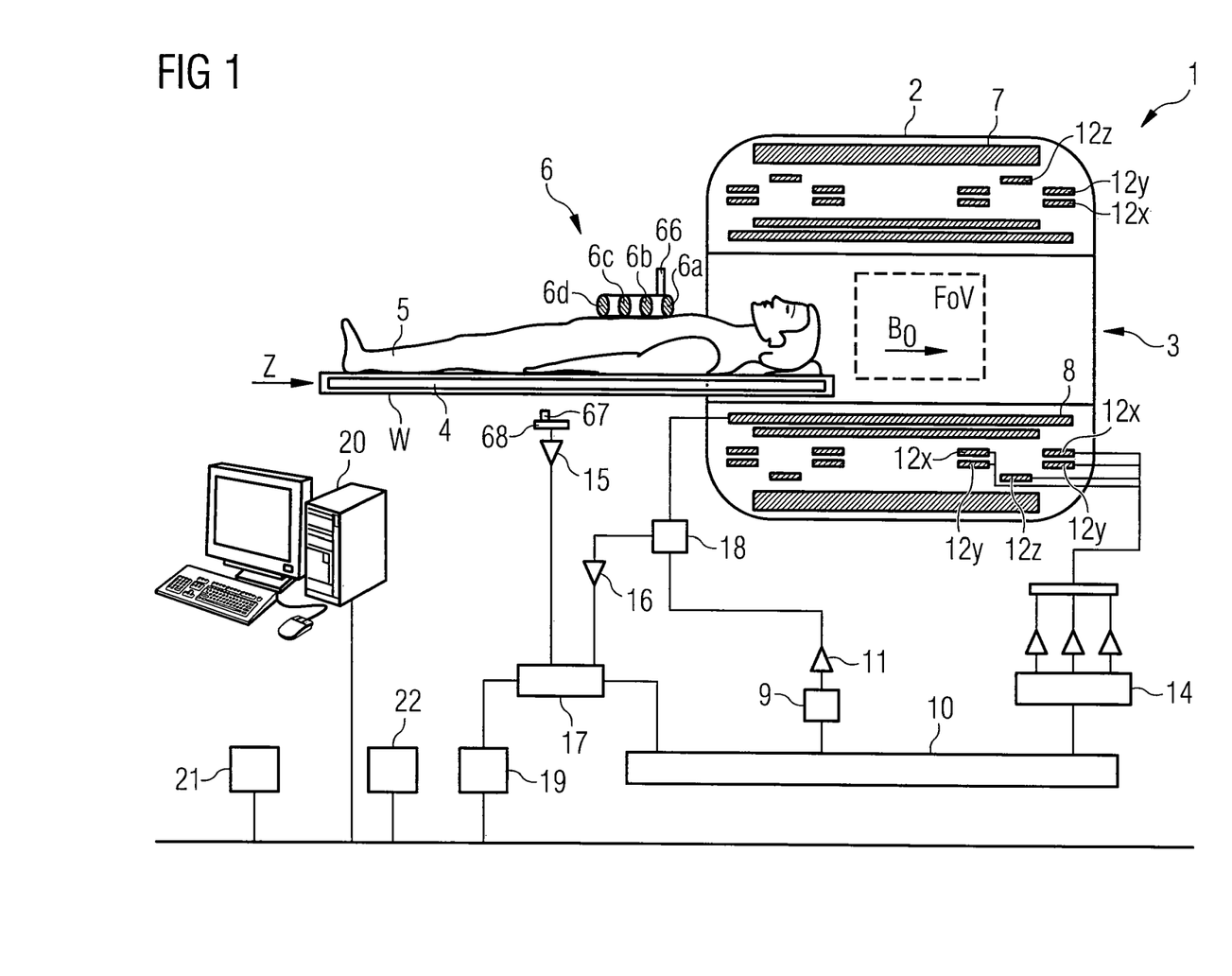
FIG. 1 shows a schematic diagram of an MRT system.

FIG. 1 shows an imaging magnetic resonance device MRT 1 with a whole body coil 2 with a tubular space 3 into which a patient bed 4 with a body of a patient 5, for example, (with or without a local coil array 6) may be moved in the direction of the arrow z in order to generate images of the patient 5. The local coil array 6 is placed on the patient 5, which makes it possible to obtain good images in a local area (e.g., Field of View (FoV)). Signals of the local coil array 6 may be evaluated by an evaluation device (e.g., including elements 67, 66, 15, 17) of the MRT 1 operable to be connected via coaxial cable or wirelessly (66, 68), for example, to the local coil array 6 (e.g., converted into images and stored or displayed). A spine coil array W disposed in or on the patient bed 4 may also be provided as a local coil array.

In order to examine the body 5 (e.g., an object under examination or a patient) using magnetic resonance imaging with the magnetic resonance device MRT 1, different magnetic fields precisely matched to each other in temporal and spatial characteristics are beamed (e.g., transmitted or sent) onto the body 5. A strong magnet (e.g., a cryomagnet 7 in a measurement cell with the tubular space 3) generates a static strong main magnetic field B0 that may be between 0.2 Tesla and three or more Tesla. The body to be examined 5 is supported on the patient bed 4 and moved into the FoV such as moved into a homogeneous area of the main magnetic field B0. The nuclear spins of atomic nuclei of the body 5 are excited via magnetic high-frequency excitation pulses that are beamed in (e.g., transmitted or sent) via a high-frequency antenna shown in FIG. 1 in simplified form as a body coil 8

(and/or if necessary, a local coil array). The high-frequency excitation pulses are generated, for example, by a pulse generation unit 9 that is controlled by a pulse sequence control unit 10. After an amplification by a high-frequency amplifier 11, the high-frequency excitation pulses are directed to the high-frequency antenna 8. The high-frequency system shown in FIG. 1 is merely indicated schematically. More than one pulse generation unit 9, more than one high-frequency amplifier 11 and a number of high-frequency antennas 8 may be used in the imaging magnetic resonance device 1.

The imaging magnetic resonance device 1 also includes gradient coils 12*x*, 12*y*, 12*z*, with which magnetic gradient fields for selective slice excitation and for local encoding of the measurement signal are beamed in during a measurement. The gradient coils 12*x*. 12*y*, 12*z* are controlled by a gradient coil control unit 14 that, like the pulse generation unit 9, is connected to the pulse sequence control unit 10.

Signals sent out from excited nuclear spins are received by the body coil 8 and/or at least one local coil array 6, are amplified by assigned high-frequency amplifiers 16 and are further processed and digitized by a receive unit 17. The recorded measurement data is digitized and is stored as complex numerical values in a k-dimensional matrix. An associated MR image may be reconstructed using a multidimensional Fourier transformation from the k-dimensional matrix occupied by values.

For a coil that may be operated both in transmit and also in receive mode such as the body coil 8 (and possibly the local coil array 6 and/or the spine coil array W), for example, the correct signal transfer is regulated by an upstream transmit-receive switch 18.

An image processing unit 19 generates an image from the measurement data. The image generated from the measurement data is displayed to a user via an operating console 20 and/or is stored in a memory unit 21. A central processing unit 22 controls the individual system components.

In MR tomography, images with a high signal-to-noise ratio (SNR) may be recorded with local coil arrays (e.g., coils, local coils). The local coil arrays are antenna systems that are attached adjacent to and above (e.g., anterior) or below (e.g., posterior) or in the body. For an MR measurement, the excited nuclei induce a voltage in the individual antennas of the local coil. The voltage is amplified by a low noise pre-amplifier (e.g. LNA, preamp) and is forwarded to the receive electronics. To improve the signal-to-noise ratio, even with high-resolution images, high field systems are employed (e.g., 1.5 T and more). Since a number of individual antennas, which are present as receivers, may be connected to an MR receive system, a switching matrix (e.g., RCCS) is integrated between receive antennas and receiver. This routes the active receive channels (e.g., mostly the active receive channels that lie right in the field of view of the magnet) to the available receivers. This makes it possible to connect a number of coil elements that are present as receivers, since for whole-body coverage, only the coils that are located in the FoV (Field of View) or in the homogeneity volume of the magnet are read out.

An antenna system may be a local coil array 6, W, which may consist of one antenna element or, as an array coil, may consist of a number of antenna elements 6*a*, 6*b*, 6*c*, 6*d* (e.g., coil elements). The antenna elements may be, for example, loop antennas (e.g., loops), butterfly coils or saddle coils. A local coil array may include coil elements, a preamplifier, further electronics (e.g., baluns), a housing, supports and a cable with a plug, through which the local coil array is connected to the MRT system. A receiver 68 attached on the system side filters and digitizes a signal received at radio frequencies by the local coil 6, for example, and transfers the data to a digital signal processing system that may derive an image or a spectrum from the data obtained by the measurement. The digital signal processing system may make the image or the spectrum available to the user for subsequent diagnosis by the user or storage, for example.

Figure 2:
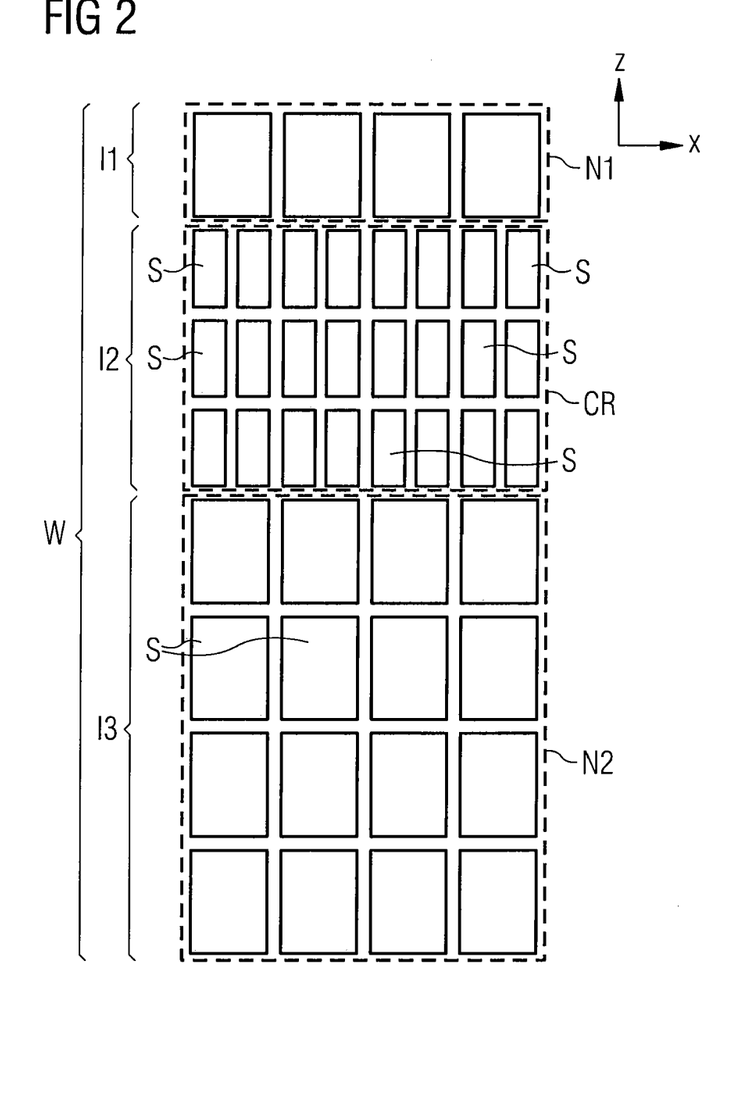
FIG. 2 shows one embodiment of a spine coil array.
Figure 3:
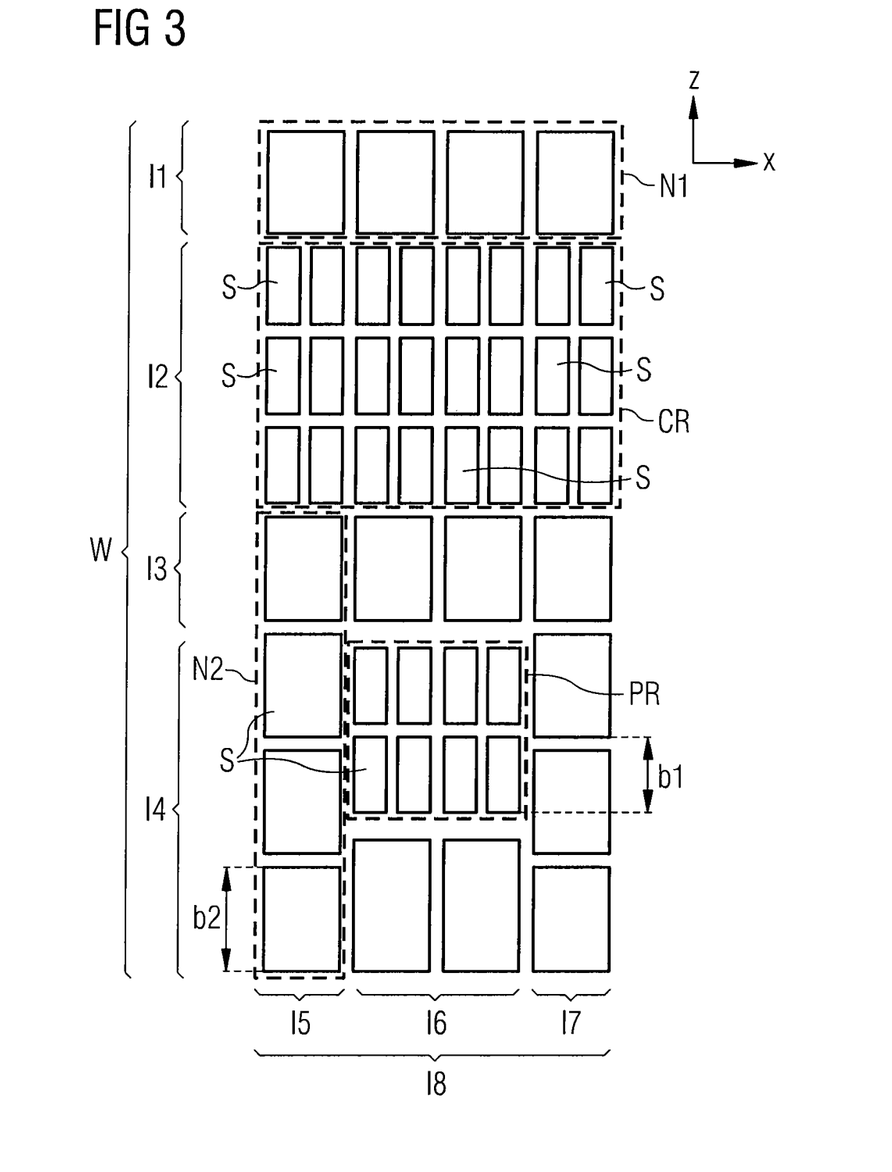
FIG. 3 shows another embodiment of a spine coil array.
Figure 4:
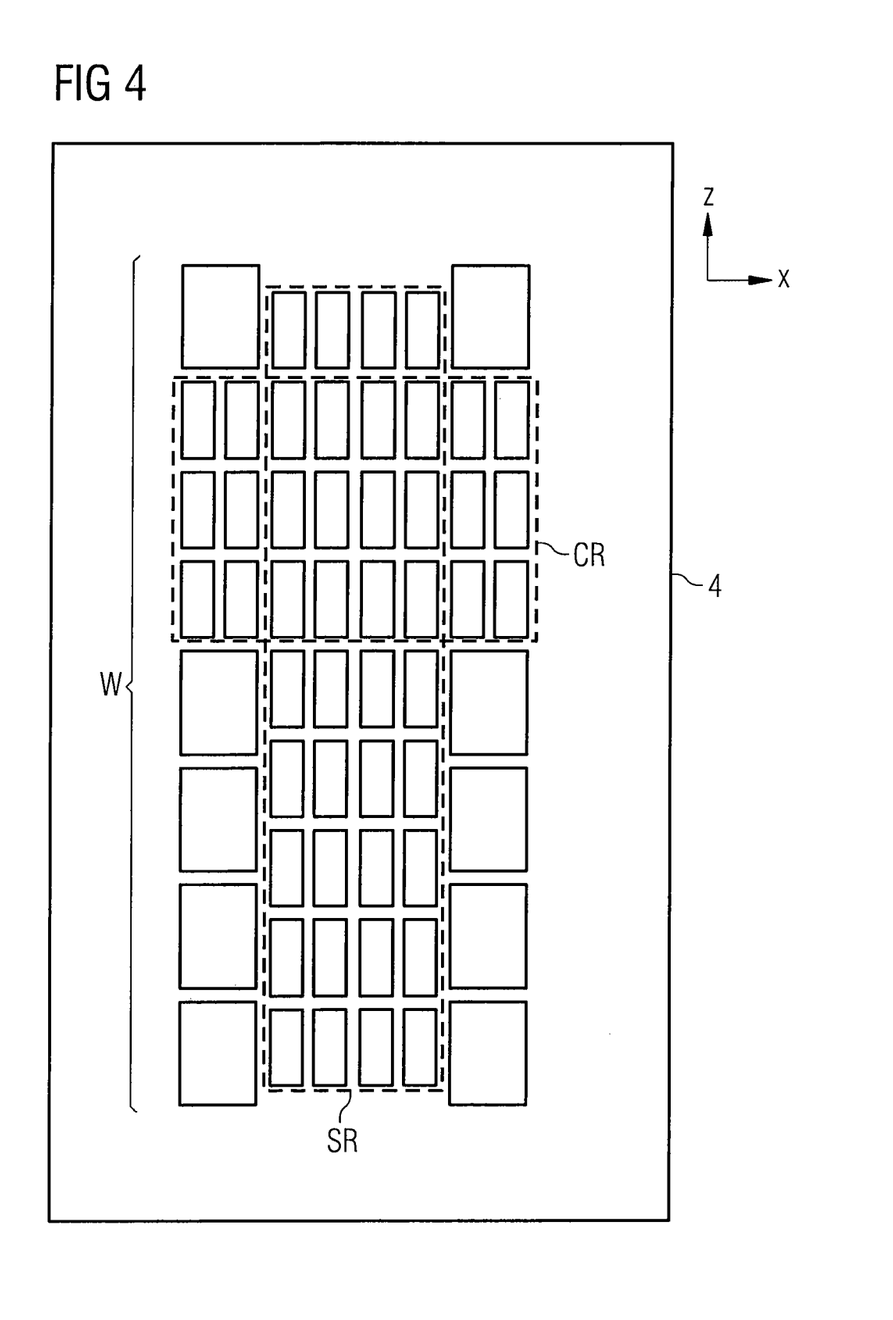
FIG. 4 shows an embodiment of a spine coil array.
Figure 5:
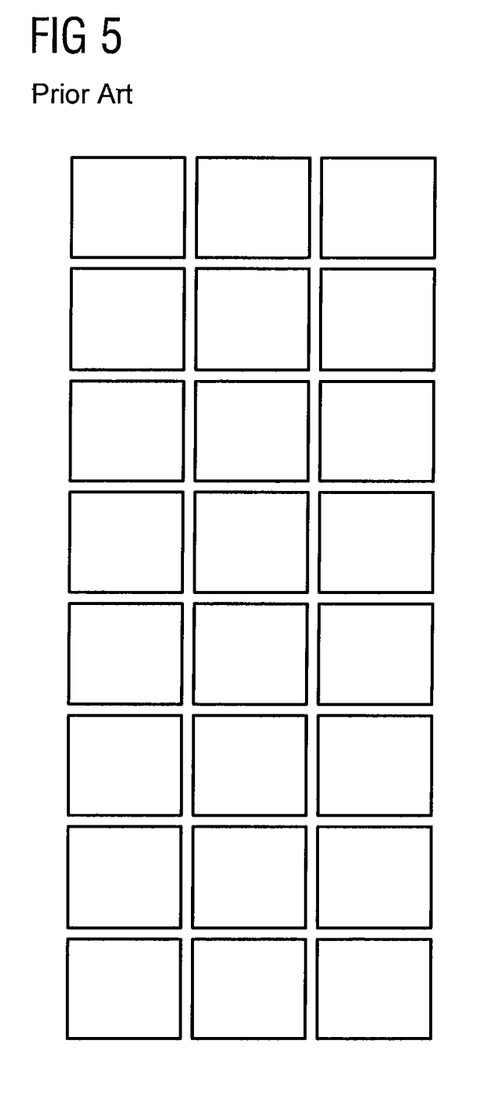
FIG. 5 shows a spine coil array of the prior art.

FIG. 2 to FIG. 4 show an overhead view of a spine coil array W of the present embodiments disposed or operable to be disposed in the patient bed 4.

In accordance with the present embodiments, a spine coil array with a multiply subdivided structure may contribute to greatly improving the imaging in individual body regions through the use of a number of elements (e.g., more surface SNR and higher acceleration factors).

"Multiply subdivided" may be that the coil features markedly different coil element densities in one or more specific areas of the anatomy. This enables characteristics of one or more dedicated coils to be integrated into a multifunctional spine coil. Accordingly, the number of additional special coils may be reduced at least by corresponding posterior parts. For cardiac examinations, only one additional anterior part may be used. Even for prostate examinations, only one additional anterior part may be used so that a part of the coil is not positioned under the patient while the patient is already lying on the bed. A spine coil array may, in such cases, be any coil array that is provided for an area, over which the spinal column of a patient to be examined may be located (e.g., a spine coil array approximately in the center (in the x direction) of the patient bed 4).

A spine coil may be subdivided a number of times. In other words, the spine coil may have a number of areas with different densities of coil elements per unit length in order to enable the spine coil (e.g., spine coil array) to also be optimized multifunctionality for use in dedicated applications such as cardiac examinations or prostate examinations. The subdivision makes provision for a greater element density in the area of specific organs. This is advantageous for cardiac examinations, prostate examinations and examinations of any areas and organs in the abdomen.

FIG. 2 shows one embodiment of a spine coil array W, with a heart examination region CR (e.g., a cardiac region; located in the dashed-line rectangle CR), within which the density of coil elements S is greater than the density of coil elements S outside the cardiac region CR (e.g., in FIG. 2, greater than in an area N1 above the area CR and in an area N2 below the area CR).

The density of coil elements S may be how many coil elements per unit length or surface there are (e.g., in the area N1, one coil element per unit length 11 and in the area CR, 3 coil elements per unit length 12; or 4 core elements in the area of the surface N1 and 24 coil elements in the area of the surface CR).

FIG. 3 shows another embodiment of a spine coil array W.

The spine coil or spine coil array W includes, as a first region, a cardiac region CR within which, the density of coil elements S is greater than the density of coil elements S outside (in FIG. 3, above and below the cardiac region CR) the cardiac region CR (e.g., greater than the density of coil elements S in the regions N1 and N2).

The spine coil array also includes, as a second region (e.g., shown by a dashed line) a prostate region PR, within which the density of coil elements S is greater than the density of coil elements S outside (e.g., in FIG. 3, above, below, to the left and to the right) of the prostate region PR.

FIG. 4 shows one embodiment of a spine coil array W in a patient bed.

The spine coil array W includes, as a first area, a cardiac region CR, within which the density of coil elements S is greater than the density of coil elements S outside (e.g., in FIG. 4, above and below) of the cardiac region CR.

The spine coil array W also includes, as a second region, an examination region SR (e.g., extending upwards and downwards in FIG. 4 or in the z direction in the MRT) for examinations of the spinal column or internal organs, within which the density of coil elements S is greater than the density of coil elements S outside (e.g., in FIG. 4, above and below) of the examination region CR.

In the embodiment shown in FIG. 4, the region CR and the region SR overlap.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A spine coil array for an imaging system, the spine coil array comprising:
a plurality of coil elements, the plurality of coil elements comprising a first region, a second region, and a third region,
wherein the density of the plurality of coil elements changes at least once from the first region to the third region in a first direction within the spine coil array and changes at least once from the second region to the third region in a second direction,
wherein the first direction is a direction in which a patient bed is moved and the second direction is at an angle to the direction in which the patient bed is moved,
wherein the first region on the patient bed includes a cardiac examination region inside of which the density of coil elements in the first direction is greater than the density of coil elements of the plurality of coil elements that are outside of and adjacent to the cardiac examination region and outside of the second region, in the first direction,
wherein the plurality of coil elements comprises a first density of coil elements per unit length running in the first direction, the first density of coil elements comprising the coil elements delimiting the first region, the first region comprising at least two coil elements of the plurality of coil elements, the two coil elements of the first region being arranged adjacent one another in the first direction, and
wherein the plurality of coil elements comprises a second density of coil elements per unit length running in the first direction, adjoining the first region, the second density of coil elements comprising the coil elements delimiting the third region, the third region comprising at least two coil elements of the plurality of coil elements, the two coil elements of the third region being arranged adjacent one another in the first direction.

2. The spine coil array as claimed in claim 1, wherein the plurality of coil elements is integrated or is operable to be integrated into the patient bed for a magnetic resonance tomography device.

3. The spine coil array as claimed in claim 2, wherein the second region on the patient bed includes a region in which there is provision for positioning the abdomen region of a patient.

4. The spine coil array as claimed in claim 1, wherein the plurality of coil elements comprises a third density of coil elements per unit length running in the second direction and delimited on each of two sides of the second region by at least one coil element, the third density of coil elements comprising the coil elements delimiting the second region, and
wherein the plurality of coil elements comprises a fourth density of coil elements per unit length running in the second direction, adjoining the second region and delimited in the second direction on each of two sides of the third region by at least one coil element, the second region and the third region each including more than one coil element, the first direction and the second direction being different.

5. The spine coil array as claimed in claim 4, wherein the first region and the second region overlap completely or partly.

6. The spine coil array as claimed in claim 4, wherein the first region and the second region do not overlap.

7. The spine coil array as claimed in claim 1, wherein the first region and the third region do not overlap.

8. The spine coil array as claimed in claim 7, wherein the second region and the third region do not overlap.

9. The spine coil array as claimed in claim 1, wherein the second region and the third region do not overlap.

10. The spine coil array as claimed in claim 2, wherein the second region and the third region do not overlap.

11. The spine coil array as claimed in claim 1, wherein the first direction and the second direction are at right angles to each other.

12. The spine coil array as claimed in claim 4, wherein a density of coil elements is a number of coil elements of the plurality of coil elements per unit of length or a number of coil elements of the plurality of coil elements per region.

13. The spine coil array as claimed in claim 1, wherein the first region, the second region, and the third region each includes more than one coil element of the plurality of coil elements.

14. The spine coil array as claimed in claim 1, wherein the length, width or length and width of coil elements of the plurality of coil elements in the second region are different than the length, width or length and width in the third region.

15. The spine coil array as claimed in claim 1, wherein a distance between two coil elements of the plurality of coil elements in the first region is different than a distance between two other coil elements of the plurality of coil elements in the third region.

16. The spine coil array as claimed in claim 2, wherein the first region and the third region do not overlap.

17. The spine coil array as claimed in claim 1, wherein the plurality of coil elements comprises a fourth region, the fourth region being adjacent to the first region, the third region and the fourth region being on opposite sides of the first region, and
wherein the density of the plurality of coil elements increases from the fourth region to the first region in the first direction.

18. The spine coil array as claimed in claim 17, wherein the fourth region is adjacent to the second region, and
wherein the density of the plurality of coil elements changes at least once from the second region to the fourth region in the second direction.

19. The spine coil array as claimed in claim 17, wherein fourth region is not adjacent to the second region.

20. A spine coil array for an imaging system, the spine coil array comprising:

a plurality of coil elements including an outer region, a cardiac examination region and a prostate examination region, wherein a density of the plurality of coil elements changes at least once from the cardiac examination region to the outer region, wherein the density of the plurality of coil elements changes at least once from the prostate examination region to the outer region, wherein the density of the plurality of coil elements changes in a first direction, a density of coil elements in the first direction inside the cardiac examination region being greater than a density of coil elements of the plurality of coil elements that are outside of and adjacent to the cardiac examination region and are outside of the prostate examination region, in the first direction;

wherein the density of the plurality of coil elements changes in a second direction;

wherein the first direction is at an angle to the second direction, wherein the plurality of coil elements comprises a first density of coil elements per unit length running in the first direction, the first density of coil elements comprising the coil elements delimiting the cardiac examination region, the cardiac examination region comprising at least two coil elements of the plurality of coil elements, the two coil elements of the cardiac examination region being arranged adjacent one another in the first direction, wherein the plurality of coil elements comprises a second density of coil elements per unit length running in the first direction, adjoining the cardiac examination region, the second density of coil elements comprising the coil elements delimiting the outer region, the outer region comprising at least two coil elements of the plurality of coil elements, the two coil elements of the outer region being arranged adjacent one another in the first direction, and wherein the first density of coil elements is greater than the second density of coil elements.

21. The spine coil array as claimed in claim 20, wherein the density of the plurality of coil elements at the cardiac examination region is greater than the density of the plurality of coil elements at the outer region, and wherein the density of the plurality of coil elements at the prostate examination region is greater than the density of the plurality of coil elements at the outer region.

22. The spine coil array as claimed in claim 20, wherein the first direction is a direction that a patient table is moved.

23. The spine coil array as claimed in claim 1, wherein the second region on the patient bed includes a prostate examination region inside of which the density of coil elements is greater than the density of coil elements of the plurality of coil elements outside of and adjacent to the prostate examination region.

24. The spine coil array as claimed in claim 23, wherein the plurality of coil elements comprises a third density of coil elements per unit length running in the first direction, the third density of coil elements comprising the coil elements delimiting the second region, the second region comprising at least two coil elements of the plurality of coil elements, the two coil elements of the second region being arranged adjacent one another in the first direction.

25. The spine coil array as claimed in claim 24, wherein the first density of coil elements is greater than the second density of coil elements, and wherein the third density of coil elements is greater than the second density of coil elements.

26. The spine coil array as claimed in claim 23, wherein the first region adjoins the third region, and the second region adjoins the third region.

27. The spine coil array as claimed in claim 26, wherein the first region does not adjoin the second region.

* * * * *